United States Patent [19]

Vikesland

[11] Patent Number: 4,621,019
[45] Date of Patent: Nov. 4, 1986

[54] NON-PHOTOSENSITIVE TRANSFER RESIST

[75] Inventor: John P. Vikesland, Woodbury, Minn.

[73] Assignee: Minnesota Mining and Manufacturing Company, St. Paul, Minn.

[21] Appl. No.: 702,827

[22] Filed: Feb. 19, 1985

[51] Int. Cl.⁴ .............................. B32B 9/00; C09J 7/02
[52] U.S. Cl. .................................... 428/347; 428/346; 428/354; 428/200; 428/901
[58] Field of Search ............... 428/346, 349, 352, 354, 428/200, 901, 40; 427/96; 156/247, 249

[56] References Cited

U.S. PATENT DOCUMENTS

| | | | |
|---|---|---|---|
| 3,469,982 | 9/1969 | Celeste | 96/35.1 |
| 3,526,504 | 9/1970 | Celeste | 96/35.1 |
| 3,782,939 | 1/1974 | Bonham et al. | 96/35.1 |
| 3,810,812 | 5/1974 | Koenig | 428/349 X |
| 4,123,581 | 10/1978 | Davis et al. | 428/349 X |
| 4,193,797 | 3/1980 | Cohen et al. | 430/258 |
| 4,247,616 | 1/1981 | Vikesland et al. | 430/192 |
| 4,414,275 | 11/1983 | Woods | 428/354 X |
| 4,515,877 | 5/1985 | Barzynski et al. | 346/200 X |

FOREIGN PATENT DOCUMENTS

| | | | |
|---|---|---|---|
| 3246774 | 6/1984 | Fed. Rep. of Germany | 428/200 |
| 0765466 | 1/1957 | United Kingdom | 428/349 |

*Primary Examiner*—Nancy A. B. Swisher
*Attorney, Agent, or Firm*—Donald M. Sell; James A. Smith; Lorraine R. Sherman

[57] ABSTRACT

A non-photosensitive transfer resist sheet material comprises in sequence
(a) a carrier support
(b) a release layer
(c) a flexible, water-insoluble, aqueous-alkaline-soluble, non-photosensitive resist layer comprising a thermoplastic organic polymer, wherein said resist is able to adhere to a surface against which it is pressed at a temperature above 60° C. The resist is useful as a protective layer in etching and coating processes in electronic circuitry technology.

27 Claims, No Drawings

NON-PHOTOSENSITIVE TRANSFER RESIST

TECHNICAL FIELD

The present invention relates to a non-photosensitive transfer resist sheet material for laminating onto an electronic circuitry article. In another aspect, a method of using the resist as a non-permanent protective layer in etching and coating processes in electronic circuitry technology is disclosed.

BACKGROUND ART

In the manufacture of electronic circuitry it is often necessary to protect part of the circuit panel from a chemical process while another part of the panel is exposed to that process. This protection is commonly provided in the printed circuit board industry by using a photoresist or screen printed resist when a pattern is to be transferred to a substrate or by using plastic backed pressure sensitive adhesive tape when image transfer is not required.

An example where protection is often required is thin film hybrid circuits where one side of the substrate contains a circuit pattern while the other side is a continuous metal coating that functions as an electrical ground plane. The thin film circuit is manufactured using an electroplating process wherein photoresist is applied to one side of the substrate and pressure sensitive adhesive tape is applied to the ground plane side.

In plating gold connector tabs on printed circuit boards, it is important to plate only the tabs themselves. To do this, in the circuitry art the tab end of the board is dipped into a gold electroplating bath. To provide definition of the tabs and to minimize gold waste, the portion of the board that may come into contact with the electroplating solution, but is not to be gold plated, is protected by plastic adhesive tape.

In the art, semiconductor fabrication requires that a resist be applied to the back side of a silicon wafer to protect it during photolithographic processes that occurs on the front side; this resist does not need to be photoimageable.

One of the important advances in printed circuit technology is the utilization of dry-film photoresists which are applied to a substrate by lamination with heat and pressure. This eliminates the need for the circuit manufacturer to coat and dry liquid photoresists, and the result is higher yield and better quality circuit production. The first such process is disclosed in U.S. Pat. No. 3,469,982 which utilizes a negative-acting photoresist. U.S. Pat. Nos. 3,526,504, 3,782,939 and 4,193,797 disclose the use of a positive-acting dry-film photoresist, and U.S. Pat. No. 4,247,616 discloses an improved dry-film positive-acting composition. However, these materials because of their photoimaging nature have a feature which is unnecessary and costly in many types of protective coating applications in the printed circuit industry.

Pressure-sensitive adhesive tapes have been used to mask circuitry that should be protected during electroplating or etching processes. While these materials themselves cost less than photosensitive resists, the labor costs involved in using tapes are significant. Labor is required to apply and trim the tape. Hand labor is required to pick the adhesive tape from the substrate after use. Following removal of the adhesive tape there is a residue that must be chemically removed from the surface of the board to insure proper long term electrical function.

SUMMARY OF THE INVENTION

Briefly, the present invention provides a multi-layered laminable sheet material for providing a protective coating to an electronic circuitry article, the laminable sheet material comprising in sequence:

a carrier support, a release layer, and a flexible, water-insoluble, aqueous-alkaline soluble, non-photosensitive resist layer comprising a thermoplastic organic polymer, the resist layer is able to adhere to surfaces against which it is pressed at a temperature above 60° C., preferably in the temperature range of 80° to 120° C., and most preferably 90° to 110° C.

In the process of the invention, the resist of the laminable sheet material is adhered to at least one surface of an electronic circuitry element. The carrier support of the laminable sheet material is strippably adhered to the non-photosensitive resist and upon removal there remains on the surface of the electronic circuitry element a protective coating which is resistant to chemical attack.

The protective, dry-film, laminable non-photosensitive resist of the present invention is particularly suited to protect fabricated electronic circuitry from chemical attack during various circuit manufacturing processes. In the alternative, it can be used as a protective coating on a substrate, for example, a copper clad laminate used in the manufacture of printed circuit boards, the other surface of which is to be fabricated into an electronic circuit. The resist can be used either in conjunction with photoresists or instead of plastic-backed pressure-sensitive adhesive tapes. For example, connector tabs on printed circuit boards can be economically gold plated by temporarily protecting the portion of the board not to be gold plated with the resist of the invention during the gold electroplating process. Labor intensive use of pressure-sensitive adhesive tape is thereby eliminated.

As used in the present invention:

"resist" means a non-photosenstive, protective, polymeric coating which remains firmly bonded to a substrate and is impervious to chemical attack during electronic circuit fabrication;

"strippably adhered" means, as is well understood in the art, that the layers are sufficiently well adhered to each other to survive mild handling without the layers completely separating and yet still be separable from each other by hand when required. This generally means that a force (delaminating resistance) of about 6 to 50 g/cm width (0.5 to 4.5 ounces per inch width) of layer is needed to separate the two layers when one layer is pulled at a 180° angle from the other at about 229 cm (90 inches) per minute. Preferably this peel force is in the range of 11 to 33 g/cm width (1 to 3 ounces per inch width). After transfer lamination to a substrate the delaminating resistance between the resist and the substrate must exceed the above-stated force (between the resist and its backing) by at least 10 percent;

"flexible" means can be bent through an angle of 90° without cracking or breaking;

"dry-film" means capable of application by lamination, i.e., without solvent;

"insoluble in water and acid" means that the coating weight is not significantly affected, i.e., less than 5% will dissolve, by immersion for one hour in water and/or acid solution at room temperature;

"soluble in aqueous alkaline solution" means that the coating will be completely removed from a substrate upon immersion in an alkaline solution at 50° C. and a pH of at least 9.0 within 30 minutes, preferably in a solution of pH of at least 12.0 within 5 minutes;

"crosslinkable" means that chemical functional groups within the coating are unreacted such that under certain conditions, such as increased temperature, a chemical reaction is induced to occur which results in the formation of an extended three dimensional polymer network;

"resistant to chemical attack" means that the coating maintains its physical integrity during chemical operations that might be carried out on a substrate during electronic circuit fabrication; such processes may include etching in, for example, ferric chloride, cupric chloride, and ammoniacal etchants, or electroplating with such metals as copper, gold, nickel, and the like under conditions well known in the art;

"electronic circuitry element" means any metallic or nonmetallic substrate which may be fabricated into an electronic circuit by means of deposition or etching; and "aqueous alkaline solution" means any aqueous solution having a pH of at least 9.0; such a solution may contain sodium hydroxide, potassium hydroxide or other hydroxide related species, for example, sodium metasilicate; it may contain other base materials, such as sodium carbonate or sodium acetate. The preferred aqueous alkaline solvent is sodium hydroxide. These aqueous-alkaline solutions can be present in a concentration in the range of 0.02 to 20 percent by weight, preferably 0.05 to 10 percent by weight.

DETAILED DESCRIPTION

The present invention provides a multi-layered electronic circuitry article containing a laminated flexible, sheet material for providing a transferable, non-photosensitive, protective coating, said article comprising in sequence:

(a) an electronic circuitry element having an electronic circuit on at least one surface thereof;

(b) a flexible, non-photosensitive resist layer comprising a thermoplastic, organic polymer, the resist layer having been laminated to at least one surface of said electronic circuitry element, the resist being nontacky at room temperature and becomes a laminable adhesive at temperatures above 60° C., preferably in the range of 80° C. to 120° C., and is water and acid-insoluble but dissolves in aqueous-alkaline solutions of pH of at least 9.0, preferably of pH of at least 10.0, and most preferably of pH of at least 12.0;

(c) a release layer; and (d) a strippably adhered carrier support.

The carrier support is any flexible polymeric sheet of any thickness which may be opaque or transparent. Preferably, it is transparent for convenience in placement during use. Preferably, it is made of such materials as polyester [e.g., poly(ethyleneterephthalate)], cellulose ester (e.g., cellulose acetate, cellulose acetate butyrate, cellulose acetate propionate), polyolefins, polyvinyl resins, and the like.

The release coating can be any material that will allow the removal of the carrier support from the resist after lamination. Such a material is preferably water and/or aqueous-alkaline soluble so as not to interfere with the dissolution of the resist during removal, and it should provide a good coupling between the resist and the carrier film prior to lamination. When dry, the delaminating resistance should be in the range of 6 to 50 g/cm width of layer. Some examples of these materials include polyvinyl alcohol, acidified copolymers of maleic anhydride and methyl vinyl ether, polyvinylpyrrolidone, methylcellulose, and polyacrylic acid polymers. Preferably these release coatings have a dry coating weight in the range of 269 to 2153 mg/m$^2$ (25 to 200 mg/ft$^2$).

The resist composition, which is not a pressure-sensitive adhesive, is a thermoplastic material which is capable of adhering to surfaces against which it is pressed (i.e., becomes tacky) above 60° C., preferably at temperatures of about 80°-120° C. while remaining nontacky at room temperature. The composition is water-insoluble, but soluble in aqueous-alkaline solutions with a pH of at least 9.0. The preferred material is a combination of a phenolformaldehyde resin and a terpolymer of acrylic acid, ethyl acrylate, and methyl acrylate. However, a wide variety of materials and combinations can be used that are known in the art. Such materials may include phenol-formaldehyde resins (including novolaks) in combination with crosslinked epoxies as disclosed in U.S. Pat. No. 4,247,616, isocyanate modified phenol-formaldehyde resins, epoxy resins, polyamides, acrylic resins and copolymers thereof, polyacrylamides, polymeric polyols, polyesters, polyamides, polystyrene-maleic anhydride-acrylate terpolymers, polyvinylphenol, nitrile phenolic resins and various other polymeric materials known in the art. The only requirements are that these materials become tacky and laminable above 60° C., preferably at 80° to 120° C., most preferably at 90° to 110° C., that they have water and acid insolubility, and have solubility in an aqueous-alkaline solution. Alkaline solutions of sodium hydroxide, potassium hydroxide, ammonium hydroxide and other basic solutions with pH of at least 10.0 are preferred, those with pH of at least 12.0 are most preferred. The resist layer can have a thickness in the range of 10 to 1000 micrometers, and preferably 25 to 75 micrometers (1 to 3 mils). No separate curing step is usually required.

The laminable resist layer may be made of any compositions which are soluble in aqueous-alkaline (or organic solvent solutions) and are not crosslinked or not sufficiently crosslinked so as to prevent bonding of that layer to a substrate when pressed and heated. Typically, it is a crosslinked or crosslinkable layer which is capable of adhering to at least one substrate of mildly abraded copper, aluminum, tin, or polyester when pressed against such a surface with a force of no more than 0.7 kg/m$^2$ (ten pounds per square inch) at a temperature no greater than 150° C. for no longer than twenty seconds. These characteristics define the term laminable in the practice of the present invention. The intrinsically crosslinkable resin (that is, without the external application of chemical crosslinking materials) may already be crosslinked to any degree consistent with its also being laminable and yet be capable of further crosslinkability. This can be achieved by various means known to the ordinarily skilled artisan such as inclusion of thermally activatable crosslinking agents, partial crosslinking of the original composition which may be further crosslinked by heating, etc.

Crosslinking in the resist layer is not required in the transfer sheet material of the present invention but it may be desirable. Controlled crosslinking tends to provide a more consistent composition with more accurately controlled solubility properties. This is particularly true with respect to thermal dimensional stability in the laminated resist which is extremely important in many fine detail processes where elevated temperatures are used, such as in plating processes.

Any polymeric material (e.g., those mentioned above) which is not crosslinked or which can be crosslinked and in its incompletely crosslinked stage is soluble in aqueous-alkaline solutions is useful in the practice of the present invention. By crosslinked, it is understood that the polymeric composition has at least some three dimensional structure and is at least ten percent (preferably at least 15 to 25 percent and more preferably 25 to 50 percent) less soluble in the selected aqueous-alkaline solution than the polymeric composition without the crosslinking therein. The skilled artisan is well aware of the various crosslinking agents which can be used, when desired, for the various polymeric materials. These, for example, include diisocyanates and epoxies, diacid chlorides, dianhydrides, diacids, polyisocyanates, polyepoxides, polyacids, aziridines, azolactones, dihalides, polyhalides, and the like. When already crosslinked, the laminable layer must remain laminable. No crosslinked layer should be so highly crosslinked that it is neither laminable nor soluble in aqueous alkaline solutions. This control is well understood by those of ordinary skill in the art and can be determined for any crosslinkable material and any particular crosslinking agent by routine experimentation. Mixtures of these crosslinkable materials together or in combination with thermoplastic materials may be readily practiced by one of ordinary skill in the art. For example, the composition of U.S. Pat. No. 4,247,616 may be used as the laminable layer. The preferred compositions of the present invention for the laminable layer comprise phenol formaldehyde resins blended with acrylic resins and particularly resole resins and acrylic terpolymers. A typical solution for determining relative solubility for crosslinked materials, as defined above, can have a pH of 12.0 to 13.5. An aqueous sodium hydroxide solution can have a pH of 13.0 to 13.5.

The resist formulation such as described above may be coated on any suitable carrier substrate, preferably those listed above, using any technique known in the art. For example, extrusion coating technique can be used on a laboratory coater. Drying conditions can be, for example, 93° C. (200° F.) zone 1, and 104° C. (220° F.) zone 2. Web speed can be, for example, 2.74 m/min (9 ft/min) for a total oven time of 4 minutes.

Solid substrates that can be protected by transfer lamination and used in electronic circuitry include the surfaces of fiber reinforced sheets, and essentially any substantially smooth, preferably flat, solid object. Among the solid substrates particularly useful according to the present invention are ceramic materials (e.g., glass, fused ceramic sheeting, and fiber reinforced sheets), metals (e.g., sheets and fibrous mats of copper, aluminum, iron, silver, chromium, and other metals, alloys, or combinations thereof), metal oxides, thermoplastic resins, (e.g., polyesters, polyamides, polyolefins, polycarbonates, acrylic resins, polyvinyl chloride, cellulose acetate butyrate, etc.), thermoset resins (e.g., epoxy resins, polysilanes, polysiloxanes, etc.), paper and, in general, any substantially smooth, preferably flat, solid surface which needs protection from chemical processes.

In the use of the multilayered sheet material of the invention, a circuit board or other substrate can be coated with the non-photosensitive transfer resist sheet material of the present invention using a hot roller laminator similar to that used to apply positive or negative dry-film photoresists. Typical temperatures of lamination include 80° to 120° C. and typical roller pressures are at least 0.035 kg/cm$^2$ (0.5 lbs/in$^2$) and preferably 0.35 to 2.1 kg/cm$^2$ (5 to 30 lbs/in$^2$); contact times range from fractions of a second to several hours, preferably 5 to 30 minutes. After lamination the backing film can be peeled off leaving the resist on the circuit board; this process as well as the chemical fabrication operation can be automated. The chemical fabrication operation can then be caused to occur on the uncoated portions of the circuit board. After these operations, the resist sheet can be dissolved easily from the circuit board using an aqueous-alkaline solution. The aqueous-alkaline solution neither harms the circuit board itself nor leaves a film residue that requires subsequent cleaning steps. The removal steps can be compatible with in-line production processes resulting in a reduction of labor costs for the user of the article.

The laminable, non-photosensitive resist sheet material of the present invention can be used in any electronic circuitry application where a temporary protective resist is desired and which can be removed by an aqueous-alkaline solution. Of particular importance is its use as a temporary chemically resistant protective coating on a printed circuit board where imaging capability is not needed. The ease of application, completeness of removal in aqueous-alkaline solution and labor savings make this product have a high commerical potential.

Various other ingredients may be included in these layers as is well understood in the art. Surfactants, dyes, fillers, lubricants, coating aids, spectral absorbers (such as ultraviolet radiation absorbers) and the like may be used as is understood in the art.

It is envisioned within the scope of the invention to provide the transfer resist sheet material (transfer tape) in the form of a roll of tape. A liner film can be used to protect the surface of the transfer tape and is removed prior to lamination.

Objects and advantages of this invention are further illustrated by the following examples, but the particular materials and amounts thereof recited in these examples, as well as other conditions and details, should not be construed to unduly limit this invention.

EXAMPLE 1

A non-photosensitive coating solution (resist composition) had the following formulation:

| | |
|---|---|
| 30 g | acetone |
| 5.4 g | BKR 2620 TM, a resole type phenol formaldehyde resin (Union Carbide, Danbury, CT) |
| 0.05 g | triethylenediamine (crosslinking catalyst) |
| 0.2 g | DDI-1410 TM, a 36 carbon atom aliphatic diisocyanate (Henkel Chemical Co., Minneapolis, MN) |
| 2.0 g | Carboset 525 TM, (ethyl acrylate, methyl acrylate, acrylic acid terpolymer B. F. Goodrich, Cleveland, OH) |

The resist composition was coated onto a 51 micrometers thick (2 mil) polyester carrier support that had been previously coated with polyvinylalcohol. The approximate coating weight of the resist 0.94 g/m$^2$ (85 mg/ft$^2$). The resist was dried for three minutes at 104° C. (220° F.) and the resulting dry thickness wa about 50 micrometers (2 mils). The resulting transfer tape was cut into a strip and laminated at 110° C. (230° F.) onto circuitry on a finished circuit board that had been preheated to 93° C. (200° F.). The resist formed a good stop-off mask that had good thermal stability for gold tab plating and other circuit fabrication processes. The film was completely dissolved from the board using a 2% by weight sodium hydroxide solution at 42° C. (75° F.).

EXAMPLES 2–4

The following non-photosensitive resin compositions and transfer tapes were prepared using the procedures of EXAMPLE 1.

| A. | 38.1 g | acetone |
| | 5.1 g | phenyl-formaldehyde resin (BKR 2620 TM, Union Carbide, Danbury, CT) |
| | 3.1 g | acrylate resin (Carboset 525 TM, Goodyear, Cleveland, OH) |
| | 0.13 g | maleic anhydride, methyl vinyl ether copolymer (Gantrez AN119 TM, GAF, NY, NY) |
| B. | 40 g | acetone |
| | 0.05 g | triethylene diamine |
| | 5.4 g | phenol-formaldehyde resin (BKR 2620) |
| | 0.1 g | phenylisocyanate |
| | 2.0 g | acrylate resin (Carboset 525) |
| C. | 50 g | toluene |
| | 10 g | acrylate resin (acryloid TM AT-70, Rohm and Haas, Inc., Phila, PA) |
| | 1.4 g | epoxy resin (DER-732 TM, Dow Chemical Co., Midland, MI) |
| | 0.3 g | methanesulfonic acid |

Compositions B and C are crosslinkable compositions. By heating the laminated composition, the crosslinking reaction was initiated and various degrees of crosslinking could be generated. Transfer tapes were prepared using these compositions and the procedure of Example 1.

EXAMPLES 5–6

The following non-photosensitive resin compositions and transfer tapes were prepared using the procedure of EXAMPLE 1:

| D. | 75 g | phenol-formaldehyde resin (BKR-2620, Union Carbide) |
| | 75 g | base-soluble acrylic resin (Carboset XL-27, B. F. Goodrich, Cleveland, OH) |
| | 325 g | methyl ethyl ketone |
| E. | 27.6 g | methyl ethyl ketone |
| | 11.0 g | phenol/formaldehyde resin (Resinox SD7280 TM, Borden Chemical, Louisville, KY) |
| | 0.23 g | 2,4,6-tris(dimethylaminomethyl)phenol, a catalyst |
| | 1.00 g | diisocyanate (DDI-1410, Henkel Chemical Co., Minneapolis, MN) |
| | 3.31 g | diglycidyl epoxy of Bisphenol A (DER 331, Dow Chemical Co., Midland, MI) |
| | 9.26 g | phthalic anhydride |
| | 0.13 g | diaminodiphenylsulfone |

Various modifications and alterations of this invention will become apparent to those skilled in the art without departing from the scope and spirit of this invention, and it should be understood that this invention is not to be unduly limited to the illustrative embodiments set forth herein.

I claim:

1. A non-photosensitive transfer resist sheet material comprising in sequence
   (a) a strippably adhered carrier support,
   (b) a release layer, and
   (c) a flexible, water-insoluble, aqueous-alkaline-soluble, non-photosensitive resist layer comprising a thermoplastic organic polymer.
   wherein said resist maintains its physical integrity during chemical operations up to a pH of at least 9.0, and wherein said resist is able to be adhered to a surface against which it is pressed at a temperature above 60° C.

2. The sheet material according to claim 1 wherein said resist layer dissolves in an aqueous-alkaline solution having a pH of at least 9.0.

3. The sheet material according to claim 1 wherein said resist layer dissolves in an aqueous-alkaline solution having a pH of at least 12.0.

4. The sheet material according to claim 1 wherein said resist is able to be adhered to said surface in the temperature range of 80° to 120° C.

5. The sheet material according to claim 1 wherein said resist layer comprises a phenol formaldehyde resin.

6. The sheet material according to claim 1 wherein said resist layer comprises an acrylic polymer.

7. The sheet material according to claim 1 wherein said organic polymer of said resist layer is crosslinkable by the application of heat.

8. The sheet material according to claim 1 wherein said resist layer comprises a phenol formaldehyde resin and an acrylic polymer.

9. The sheet material according to claim 1 wherein said resist layer comprises (1) an acrylic copolymer or terpolymer and (2) a phenol formaldehyde resin crosslinked with a polyisocyanate.

10. A multi-layered electronic circuitry article consisting essentially of:
    (a) an electronic circuitry element having an electronic circuit on at least one surface thereof, and
    (b) laminated at a temperature of at least 60° C. over at least one surface of said electronic circuitry element at least one flexible, water-insoluble, non-photosensitive, aqueous-alkaline soluble resist layer comprising a thermoplastic organic polymer.

11. A multi-layered electronic circuitry article comprising:
    (a) an electronic circuitry element having an electronic circuit on at least one surface thereof,
    (b) laminated at a temperature of at least 60° C. over at least one surface of said electronic circuitry element at least one flexible, water-insoluble, non-photosensitive, aqueous-alkaline soluble resist layer comprising a thermoplastic organic polymer, and
    (c) a strippable carrier support adhered to said resist layer.

12. The article according to claim 11 further comprising a release layer between said strippable carrier support and said resist layer.

13. The article according to claim 10 wherein said resist layer dissolves in an aqueous-alkaline solution having a pH of at least 9.0.

14. The article according to claim 10 wherein said resist layer dissolves in an aqueous-alkaline solution having a pH of at least 12.0.

15. The article according to claim 10 wherein said resist is able to be adhered in the temperature range of 80° to 120° C.

16. The article according to claim 10 wherein said resist layer comprises a phenol formaldehyde resin.

17. The article according to claim 10 wherein said resist layer comprises an acrylic polymer.

18. The article according to claim 10 wherein said resist layer comprises a phenol formaldehyde resin and an acrylic polymer.

19. A method of protecting an electronic circuitry element with a laminated non-photosensitive resist layer comprising the steps of
    (a) providing an electronic circuitry element having a circuit panel on at least one surface thereof,
    (b) providing a non-photosensitive transfer resist sheet material comprising in sequence
        (1) a carrier support,
        (2) a release layer, and
        (3) a flexible, water-insoluble, aqueous-alkaline soluble, non-photosensitive resist layer comprising thermoplastic organic polymer, said resist layer being laminable at a temperature above 60° C.,
    (c) contacting said transfer resist sheet material to at least one surface of said electronic circuitry element,
    (d) applying heat at a temperature above 60° C. and at a pressure and time sufficient to adhere said resist layer of said transfer resist sheet material to said electronic circuitry element, and
    (e) stripping away said carrier support to provide said electronic circuitry element bearing a protective resist layer.

20. The method according to claim 19 wherein said resist layer dissolves in an aqueous-alkaline solution having a pH of at least 9.0.

21. The method according to claim 19 wherein said resist layer dissolves in an aqueous-alkaline solution having a pH of at least 12.0.

22. The method according to claim 19 wherein said resist is laminated in the temperature range of 80° to 120° C.

23. The method according to claim 19 wherein said resist layer comprises a phenol formaldehyde resin.

24. The method according to claim 19 wherein said resist layer comprises an acrylic polymer.

25. The method according to claim 19 wherein said resist layer comprises a phenol formaldehyde resin and an acrylic polymer.

26. The method according to claim 19 wherein said resist layer comprises (1) an acrylic copolymer or terpolymer and (2) and phenol formaldehyde resin crosslinked with a polyisocyanate.

27. The method according to claim 19 wherein said organic polymer of said resist layer is crosslinkable by the application of heat.

* * * * *